United States Patent
Watson et al.

(10) Patent No.: US 6,467,960 B1
(45) Date of Patent: Oct. 22, 2002

(54) AIR BEARING LINEAR GUIDE FOR USE IN A VACUUM

(75) Inventors: Douglas C. Watson, Campbell; W. Thomas Novak, Hillsborough, both of CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/642,080

(22) Filed: Aug. 18, 2000

(51) Int. Cl.⁷ ............................................ F16C 32/06
(52) U.S. Cl. ........................................ 384/12; 384/15
(58) Field of Search ........................ 384/12, 15, 131; 269/55, 82, 83; 318/67, 38, 135, 687

(56) References Cited

U.S. PATENT DOCUMENTS

| | | | |
|---|---|---|---|
| 3,508,430 A | * 4/1970 | Edmondson | 384/12 X |
| 4,191,385 A | 3/1980 | Fox et al. | 277/432 |
| 4,234,175 A | 11/1980 | Sato et al. | |
| 4,351,574 A | * 9/1982 | Furukawa et al. | 384/8 |
| 4,417,770 A | 11/1983 | Tucker | |
| 4,425,508 A | 1/1984 | Lewis, Jr. et al. | 250/442.11 |
| 4,465,325 A | * 8/1984 | Faure et al. | 384/12 |
| 4,648,723 A | 3/1987 | Sugiyama et al. | |
| 4,749,283 A | * 6/1988 | Yokomatsu et al. | 384/12 |
| 4,810,889 A | 3/1989 | Yokomatsu et al. | 250/492.2 |
| 4,916,340 A | 4/1990 | Negishi et al. | |
| 4,969,169 A | 11/1990 | Forsyth et al. | 378/34 |
| 4,993,696 A | 2/1991 | Furukawa et al. | 269/73 |
| 5,218,896 A | 6/1993 | Furukawa | 384/12 X |
| 5,623,853 A | 4/1997 | Novak et al. | |
| 5,760,564 A | 6/1998 | Novak | 318/687 |
| 5,784,925 A | * 7/1998 | Trost et al. | 384/12 |
| 5,839,324 A | 11/1998 | Hara | 74/490.09 |
| 6,126,169 A | 10/2000 | Sogard et al. | 277/321 |

FOREIGN PATENT DOCUMENTS

| | | |
|---|---|---|
| JP | 58-5523 | 1/1983 |
| JP | 5-30547 | 4/1993 |

OTHER PUBLICATIONS

Ohtsuka et al., The Vertical Traverse Stage In Vacuum Condition, 1990, JSME International Journal, Series III, vol. 33, No. 1 pp. 61–64.

U.S. patent application No. 09/637,605 which was filed on Aug. 15, 2000.

* cited by examiner

*Primary Examiner*—Thomas R. Hannon
(74) *Attorney, Agent, or Firm*—Beyer Weaver & Thomas

(57) ABSTRACT

Apparatus associated with air bearings which are suitable for use in an environment with high vacuum levels. According to one aspect, an air bearing linear guide that is suitable for use in a vacuum environment is arranged to substantially wrap around a portion of a guide beam without covering the ends of the guide beam. The air bearing linear guide includes a sleeve that has an inner surface, and a first air pad that is located on the inner surface of the sleeve. A first land is arranged on the inner surface of the sleeve at least partially around the first air pad, e.g., such that the land is substantially offset from the perimeter of the air pad. The first land and the air pad define a first channel therebetween. Finally, the air bearing linear guide includes a second land that is arranged to substantially seal the inner surface of the sleeve from the vacuum environment

25 Claims, 9 Drawing Sheets

AIR BEARING LINEAR GUIDE FOR USE IN A VACUUM

CROSS REFERENCE TO RELATED APPLICATION

This patent application is related to co-pending provisional U.S. patent application Ser. No. 9/870,881, filed concurrently herewith, which is incorporated herein by reference in its entirety.

BACKGROUND OF THE INVENTION

1. Field of Invention

The present invention relates generally to lithography. More particularly, the present invention relates to a stage for use in an electron beam projection lithography system.

2. Description of the Related Art

Lithography processes, e.g., photo-lithography processes, are integral to the fabrication of wafers and, hence, semiconductor chips. Conventional systems used for lithography include optical lithography systems and electron beam projection systems. Many optical lithography systems and electron beam projection systems may use a direct writing process to "write" on wafers. However, direct writing processes are often relatively slow, as will be appreciated by those skilled in the art.

In order to increase the speed at which wafers may be written to, electron beam projection systems, as well as optical lithography systems, may project beams of finite area through patterns. The patterns are generally resident on a reticle, which effectively serves as a mask or a negative for a wafer. For an electron beam projection system, a relatively broad beam of electrons may be collimated and provided to a reticle, which may be a silicon wafer, e.g., a wafer that is suitable for scattering with angular limitation projection electron beam lithography or a stencil-type wafer. Typically, rather than absorbing the beam, the pattern deflects portions of the beam in order to prevent electrons from being ultimately focused onto a wafer.

FIG. 1a is a diagrammatic representation of one standard configuration of a lens system of an electron beam projection system. In general, a lens system 10 includes an illumination lens 12 and a projection lens 18. An electron beam is generated by an electron gas, and arranged to pass through illumination lens 12, through a reticle 16 held in a reticle chamber 14. It should be appreciated that reticle chamber 14 is typically a vacuum chamber. As an electron beam passes through reticle 16, portions of the electron beam are allowed to pass through reticle 16, while other portions of the electron beam may be scattered to prevent those portions from being focused onto a wafer 22 held in a wafer chamber 20, i.e., a vacuum chamber. In other words, reticle 16 acts as a mask to effectively mask out part of an electron beam. Projection lens 18 is arranged to project the pattern of electrons onto wafer 22.

In general, wafer 22 is mounted on a wafer stage (not shown) to facilitate the movement of wafer 22 beneath projection lens 18. The design of a wafer stage for use in an electron beam projection system may be complicated, as an electron beam projection system generally must not include moving magnets or metals which alter the magnetic field associated with the electron beam projection system and, hence, the electron beam.

Although separate vacuum chambers may be used to house a reticle and a wafer, an entire lens system may generally be housed in a single vacuum chamber. FIG. 1b is a diagrammatic representation of a standard lens system of an electron beam projection system, which is contained within a vacuum chamber. Like lens system 10 of FIG. 1a, a lens system 50 includes an illumination lens 12' and a projection lens 18'. An electron beam is arranged to pass through illumination lens 12'. The electron beam then passes from illumination lens 12' to a reticle 16' which masks out part of the electron beam. After passing through reticle 16', portions of the electron beam pass through projection lens 18' and onto wafer 22'. As shown, illumination lens 12', reticle 16', projection lens 18', and wafer 22' are all contained within a vacuum chamber 60.

A characteristic of electron beam projection systems is the ability to dynamically move a projection image to follow a stage, which is generally not possible with an optical system, as will be appreciated by those skilled in the art. In addition, electron beam lens systems typically correct for relatively small errors in relative stage positions, whereas optical systems generally do not.

It is often desirable to have moving parts associated with an electron beam projection system. For example, a wafer may be placed on a wafer stage which enables the wafer to be positioned beneath a projection column as appropriate. The use of air bearing guides to facilitate the movement of a wafer stage within a vacuum would generally provide for relatively high stiffness, substantially no friction, and low noise while the air bearing guide was moving over a guide beam. However, conventional air bearings typically leak air around their perimeters. Hence, air flow leaks into a vacuum chamber from an air bearing guide would reduce the vacuum level in a vacuum chamber. In general, the allowable leakage flow from an air bearing depends upon the acceptable vacuum level in a vacuum chamber, as well as the vacuum pumping capability associated with the vacuum chamber. Typically, for an electron beam projection system, desired vacuum levels are relatively high, e.g., on the order of approximately 1e–6 Torr. A conventional air bearing generally leaks flow many orders of magnitude above a tolerable, or acceptable, level for an electron beam projection system.

Therefore, what is needed is a method and an apparatus for enabling wafers to be positioned efficiently within an electron beam projection system. That is, what is desired is an air bearing linear guide which is suitable for use in a relatively high vacuum environment.

SUMMARY OF THE INVENTION

The present invention relates to air bearings which are suitable for use in an environment with high vacuum levels. According to one aspect of the present invention, an air bearing linear guide that is suitable for use in a vacuum environment is arranged to substantially wrap around a portion of a guide beam without covering the ends of the guide beam. The air bearing linear guide includes a sleeve that has an inner surface, and a first air pad that is located on the inner surface of the sleeve. A first land is arranged on the inner surface of the sleeve at least partially around the first air pad, e.g., such that the land is substantially offset from the perimeter of the air pad. The first land and the air pad define a first channel therebetween which is arranged to be vented to a non-vacuum environment to allow the air pad to function as if it were in a non-vacuum environment, e.g., an atmospheric pressure environment. Finally, the air bearing linear guide includes a second land that is arranged to substantially seal the inner surface of the sleeve from the vacuum environment. Sealing the inner surface of the sleeve from the vacuum environment, e.g., by minimizing the distance between the edge of the sleeve and the guide beam, prevents significant leakage of flow from the air bearing linear guide into a vacuum environment. In one embodiment, the second land is arranged to substantially seal the sleeve against the guide beam.

In another embodiment, a third land is spaced apart from the first land to at least partially define a second channel which is arranged to contain gas at a relatively low vacuum. In such an embodiment, a first area on the inner surface of the sleeve, the first area may also be in communication with the second channel and is, further, arranged to-be in fluid communication with the guide beam.

According to another aspect of the present invention, a guide bearing, the guide bearing which is arranged to interface with a guide beam and is also arranged to move with respect to the guide beam includes a sleeve, a plurality of air pads, a plurality of raised areas, and first and second pluralities of lands. The sleeve has both an outer surface which is exposed to a vacuum and an inner surface. The air pads are included on the inner surface, and are of a first height. Each raised area is arranged to define an individual channel between each raised area and a corresponding air pad, and has a height which is approximately the same as the first height. Each individual channel is arranged to vent to an atmospheric pressure environment. The lands are each arranged to define a channels in cooperation with raised areas and other lands. Channels are defined between each land of the first plurality of lands and raised areas to accommodate relatively low vacuum flow, while channels are defined between each land of the second plurality of lands and each land of the first plurality of lands, to accommodate relatively high vacuum flow.

According to still another aspect of the present invention, a guide bearing system includes an air bearing linear guide and a first guide beam. The air bearing linear guide includes a sleeve with an inner surface on which an air pad is mounted. The air pad is separated from a first land by a first area which substantially surrounds a perimeter of the air pad. The first area is arranged to be in communication with a source of substantially atmospheric pressure. The air bearing linear guide is generally arranged to substantially wrap around a non-end section of the first guide beam and to slide with respect to the guide beam. The guide beam includes a first duct and a second duct which are each in fluid communication with the air bearing linear guide. In one embodiment, wherein a gap is defined between a top surface of the air pad and an outer surface of the first guide beam that is approximately equivalent to a flying height of the air bearing linear guide.

In one embodiment, the first land is separated from a second land by a second area, and the second area being arranged to be in fluid communication with the first duct. In such an embodiment, the second land may be separated from a third land by a third area which is in fluid communication with the second duct. The guide bearing system may also include a second guide beam which includes a first section and a second section. The second guide beam maybe coupled to the air bearing linear guide such that a first transfer port of the air bearing linear guide is in fluid communication with the second area and the first section, and a second transfer port of the air bearing linear guide in fluid communication with the third area and the second section.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

The configuration of a wafer stage which is suitable for use in an electron beam projection system generally may not include conventional air bearings, as conventional air bearings typically leak air into the surrounding environment. The leakage of air from air bearings into a vacuum chamber associated with an electron beam projection system would likely significantly reduce the vacuum level in a vacuum chamber, thereby adversely affecting an electron beam lithography process. In other words, a conventional air bearing typically leaks flow many orders of magnitude above an acceptable level for an electron beam projection system.

An air bearing linear guide which does not leak a significant amount may be used in a vacuum chamber. Such an air bearing linear guide may generally include air flow evacuation stages which are incorporated into the linear guide in order to reduce the volume of gas which reaches the vacuum chamber and the volume of gas that is pumped out of the vacuum chamber. In one embodiment of such a linear guide, any leakage is generally insignificant enough that there is substantially very little affect on the overall vacuum level. Each air pad of an air bearing linear guide may be surrounded by a channel which is vented substantially directly to atmospheric pressure. As such, each air pad may effectively operate as if it were in a non-vacuum environment, while the linear guide which includes the air pads operates in a vacuum. Therefore, the linear guide is able to operate within a vacuum with an essentially negligible amount of friction, a relatively high stiffness, and low noise.

Figure 1A:
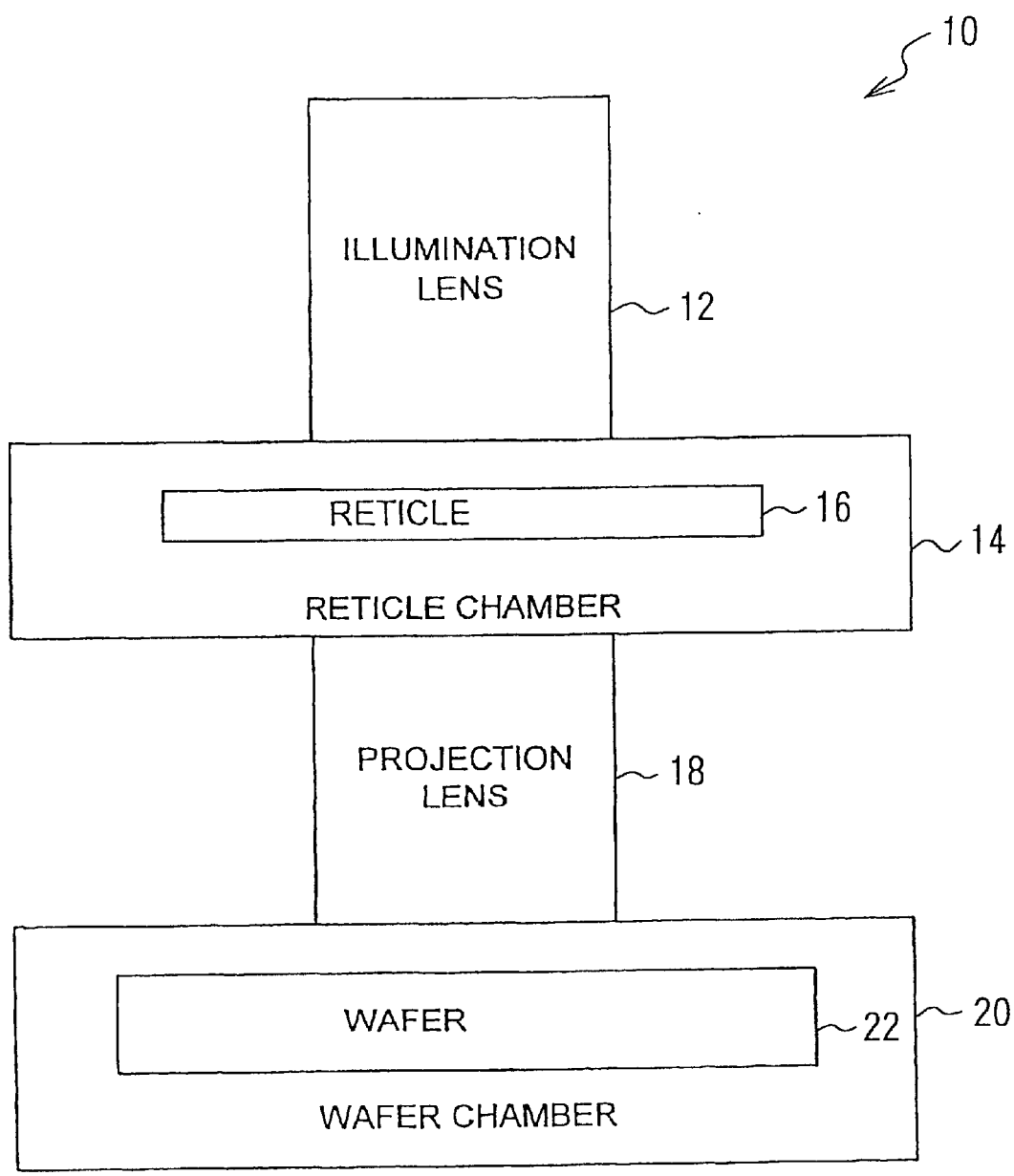
FIG. 1a is a block diagram representation of one configuration of the lens system of an electron beam projection system.
Figure 1B:
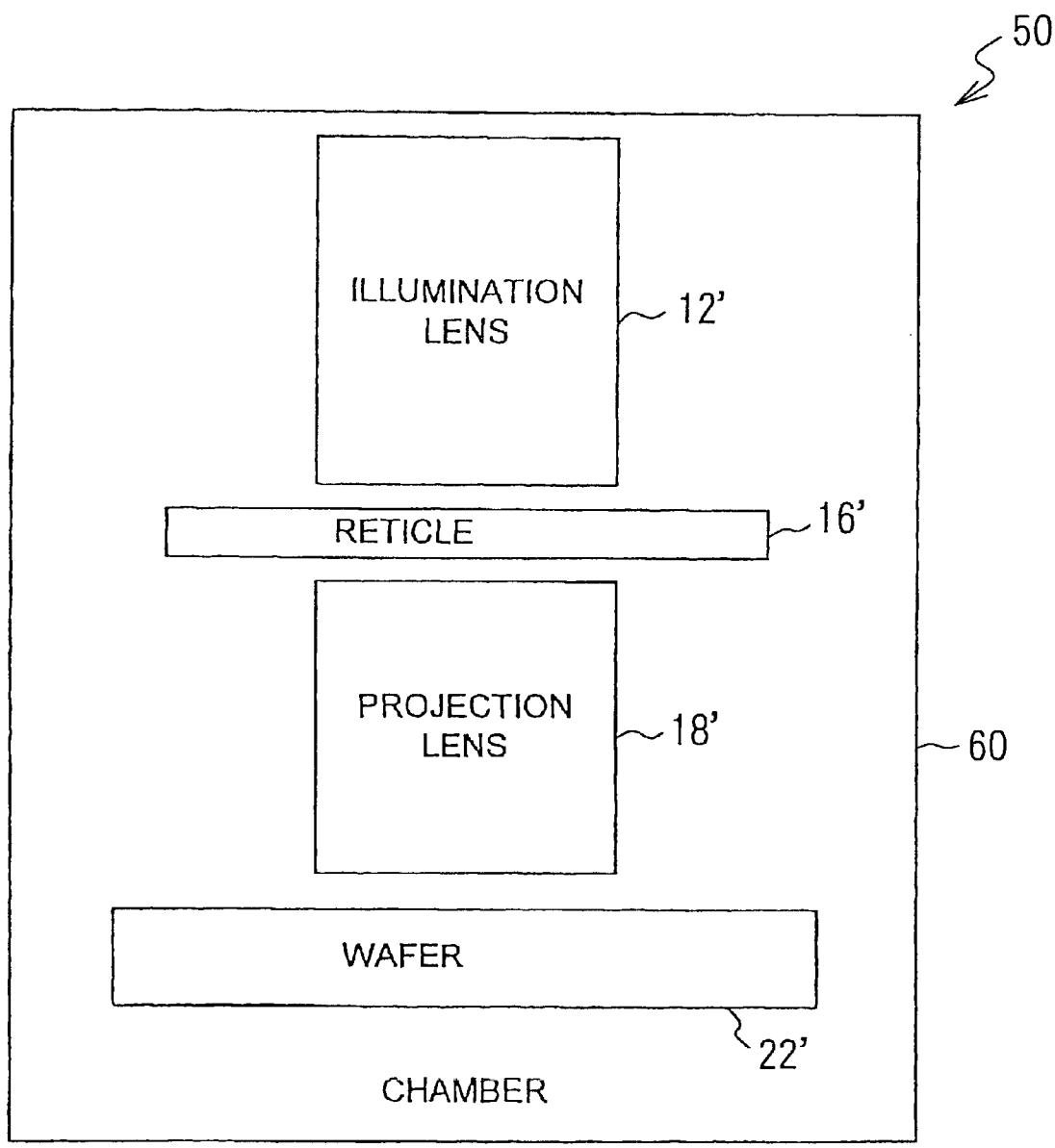
FIG. 1b is a block diagram representation of a second configuration of the lens system of an electron beam projection system.
Figure 2:
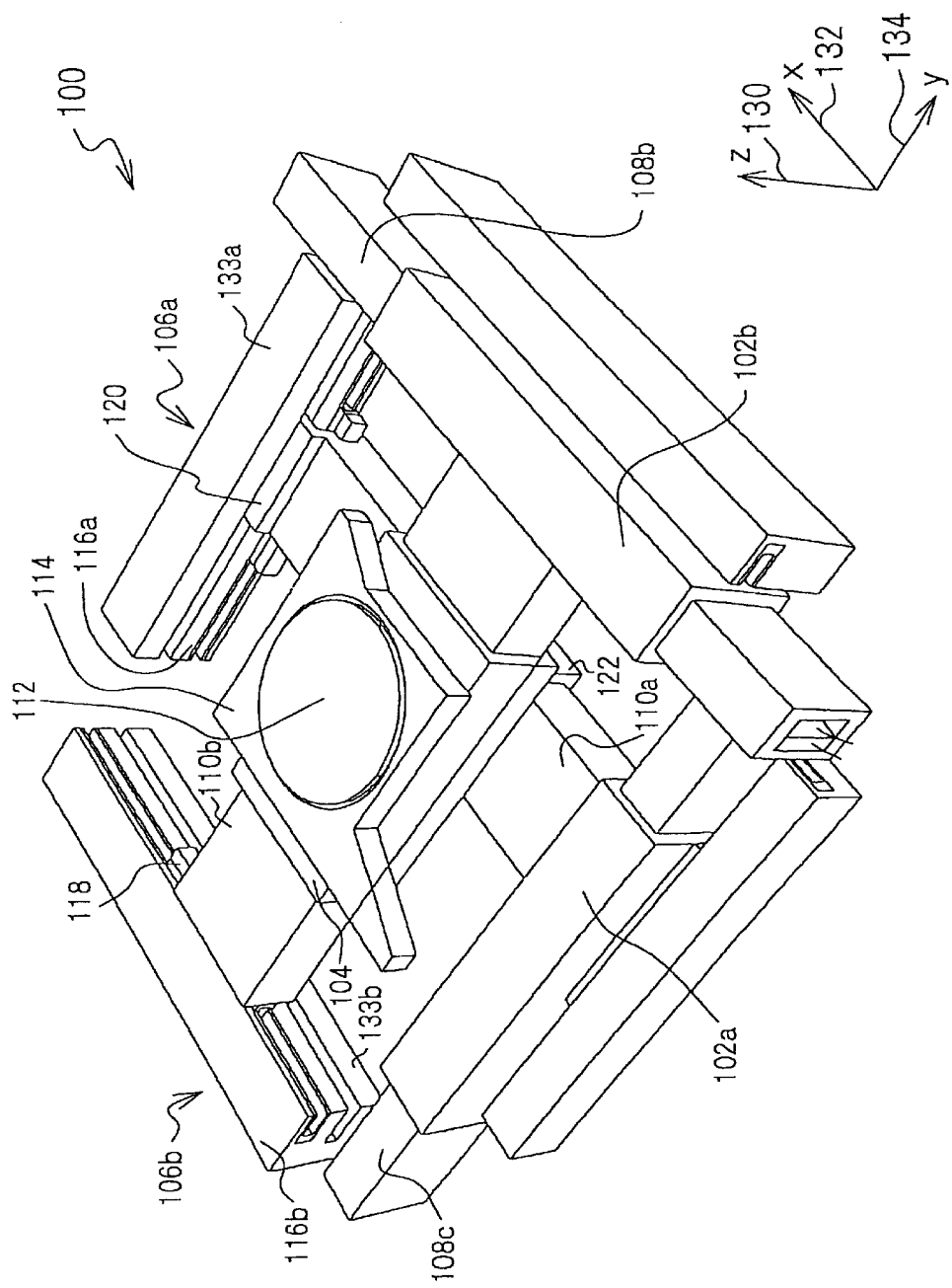
FIG. 2 is a diagrammatic representation of a wafer stage assembly suitable for use as a part of an electron beam projection system in accordance with an embodiment of the present invention.

FIG. 2 is a diagrammatic three-dimensional representation of a wafer stage assembly which includes a plurality of air bearing linear guides, and is suitable for scanning a wafer table along two axes in accordance with an embodiment of the present invention. A wafer stage assembly 100 is arranged to cause a wafer 112 situated on a table 114 to scan along an x-axis 132 and a y-axis 134. As will be understood by those skilled in the art, in some embodiments, wafer 112 may also be moved along a z-axis 130, e.g., through the use of servo motors (not shown) attached to either table 114 or entire assembly 100.

Table 114 is coupled, generally substantially fixably, to an air bearing linear guide 104. Air bearing linear guide 104, which may be considered to be a slider bearing, is arranged to move over a guide beam 110b which, in turn, is coupled to an air bearing linear guide 102b. Air bearing linear guide 102b and guide beam 110b will be discussed below with reference to FIGS. 3a–c and FIG. 4, respectively.

Air bearing linear guide is coupled to guide beam 110b and, further, is coupled to an extension section 118 that effectively moves within a guide section 106b which includes a magnet track 116b and an air guide 133b. Guide beam 100b is supported along z-axis 130 and rotationally supported about y-axis 134 by extension section 118 and linear guide 102b. In addition, guide beam 110b is constrained from rotation about x-axis 132 and z-axis 134. A coil portion of extension section 118 moves within magnet track 116b to form a linear motor, while an extension of extension section 118 is arranged to move within air guide 133b. Hence, extension section 118 slides within guide section 106b and enables linear guide 102b to move over guide beam 108b.

Air bearing linear guide 104 is substantially fixably coupled to a cross bearing 122 which is arranged to move over a guide beam 110a. Cross bearing 122 may be arranged on guide beam 110a such that guide beam 110a may experience yaw, e.g., rotation about z-axis 130. In order for guide beam 110a to yaw, cross bearing 122 may include single air pads on substantially only the two vertical inner sides of cross bearing 122. This substantially minimizes the yaw stiffness, i.e., rotational stiffness about z-axis 130, between cross bearing 122 and guide beam 110a. In addition, air pads on horizontal inner surfaces of crossbearing 122 may be added for stiffness, or eliminated such that a stage made up of substantially only cross bearing 122 and linear guide 104 is effectively constrained about x-axis 132, along z-axis 130, about x-axis 132, about y axis 134, and about z-axis 130 substantially only by linear guide 104.

As shown, guide beam 110a is coupled to an air bearing linear guide 102a, which is arranged to move over a guide beam 108a. In one embodiment, air bearing linear guide 102a has a similar structure to that of air bearing linear guide 102b, while guide beam 108a has a similar structure to guide beam 108b. Like guide beam 110b, guide beam 110a also has an extension section 118 that is arranged to move within a guide section 106a which includes a coil 116a and an air guide 133a.

Linear motors, as for example linear motors including moving coils and fixed magnet tracks 116, used to enable wafer 112 to move, may be arranged such that magnet tracks 116 are substantially stationary, thereby effectively eliminating issues associated with moving magnets. While the linear motor coils are relatively large conductors, the linear motor coils may be positioned relatively far from an electron beam column, and may be well shielded by the magnetic tracks associated with the linear motors. Further, while the linear motor coils may generate relatively large magnetic fields when energized, during scanning, the amount of current used for accelerating may be small and, as a result, have very little effect on an electron beam.

Figure 3A:
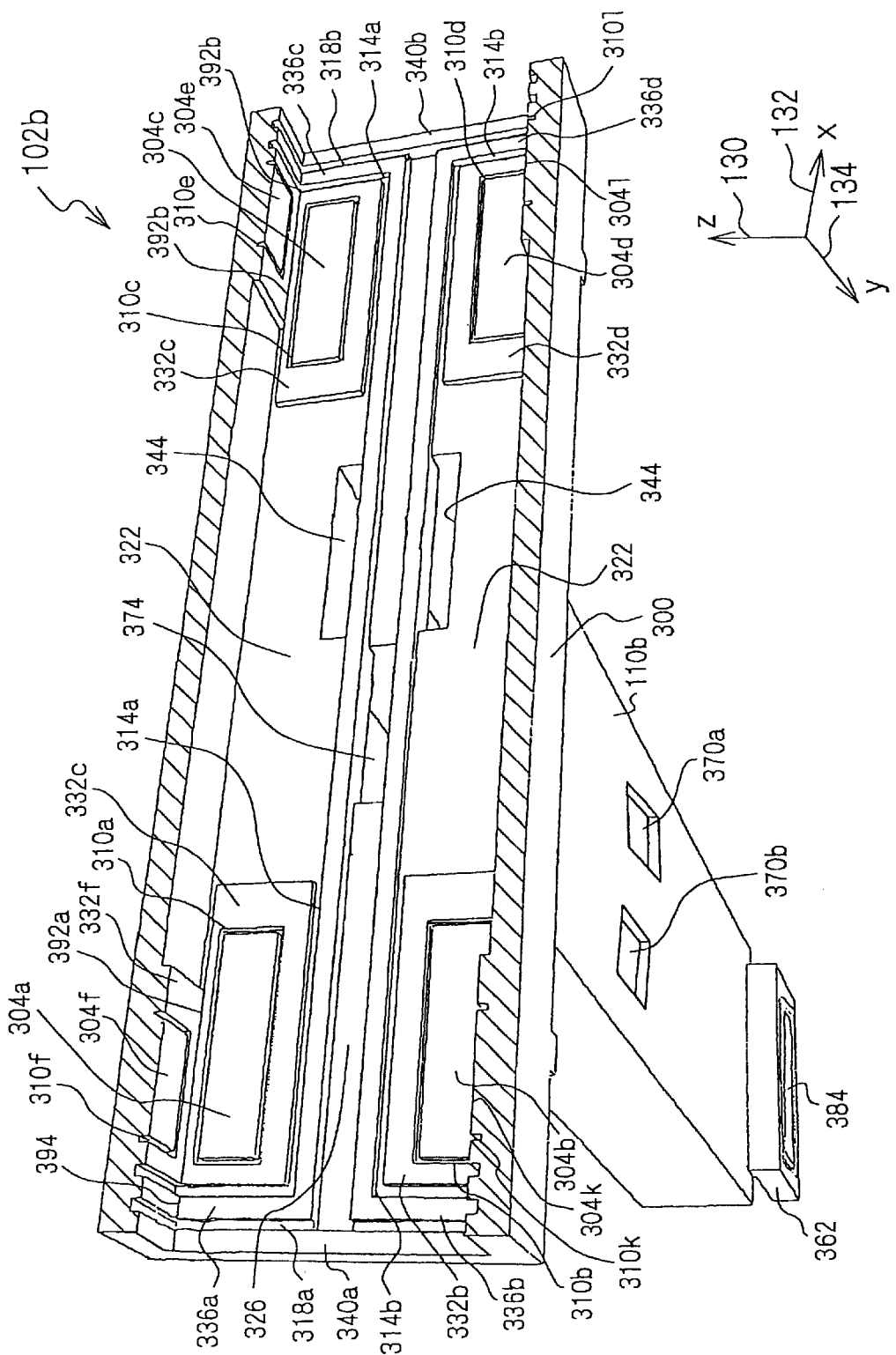
FIG. 3a is a diagrammatic representation of a first section of an air bearing linear guide, e.g., air bearing linear guide 102b of FIG. 2, in accordance with an embodiment of the present invention.
Figure 3B:
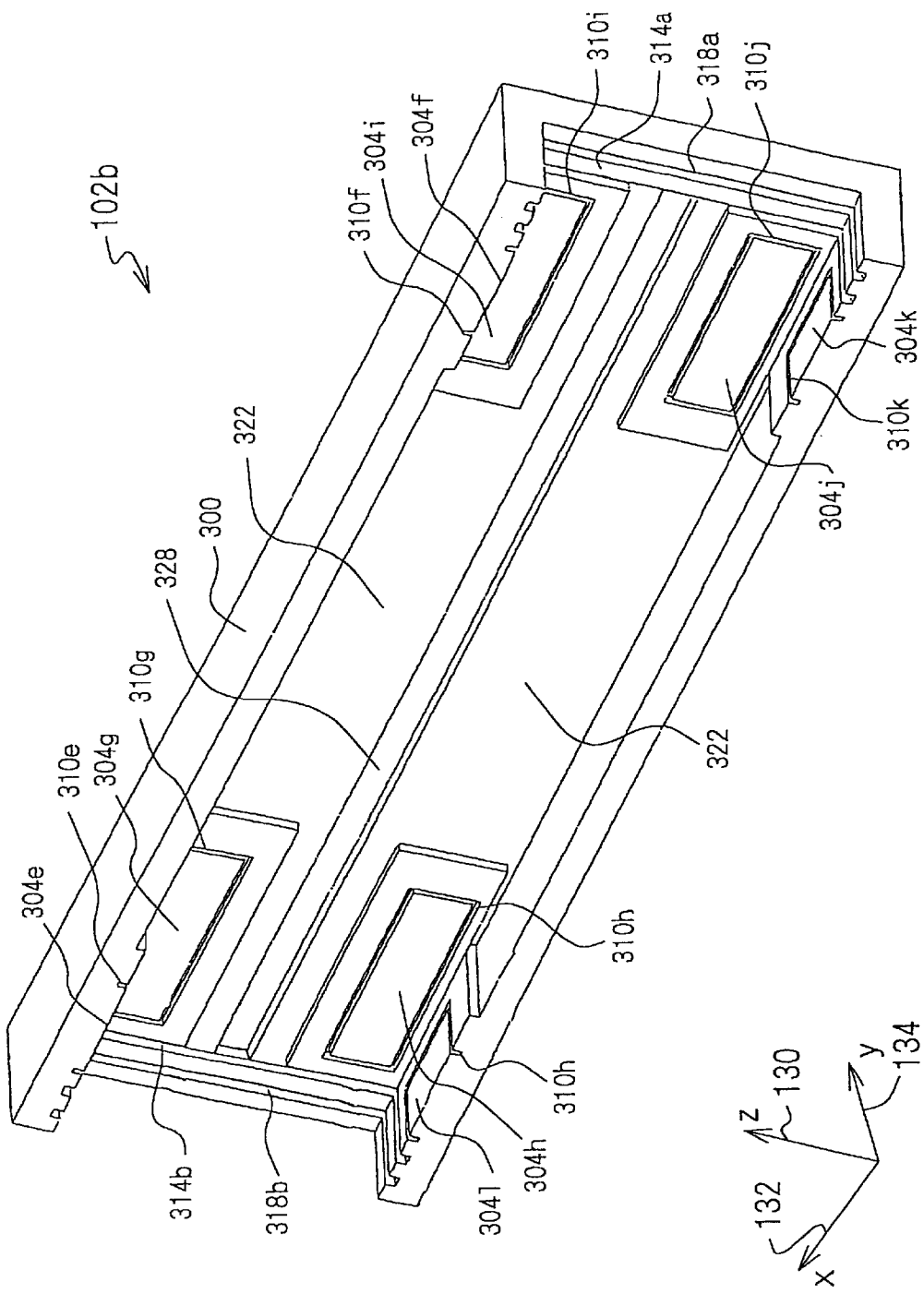
FIG. 3b is a diagrammatic representation of a second section of an air bearing linear guide, e.g., air bearing linear guide 102b of FIG. 2, in accordance with an embodiment of the present invention.
Figure 3C:
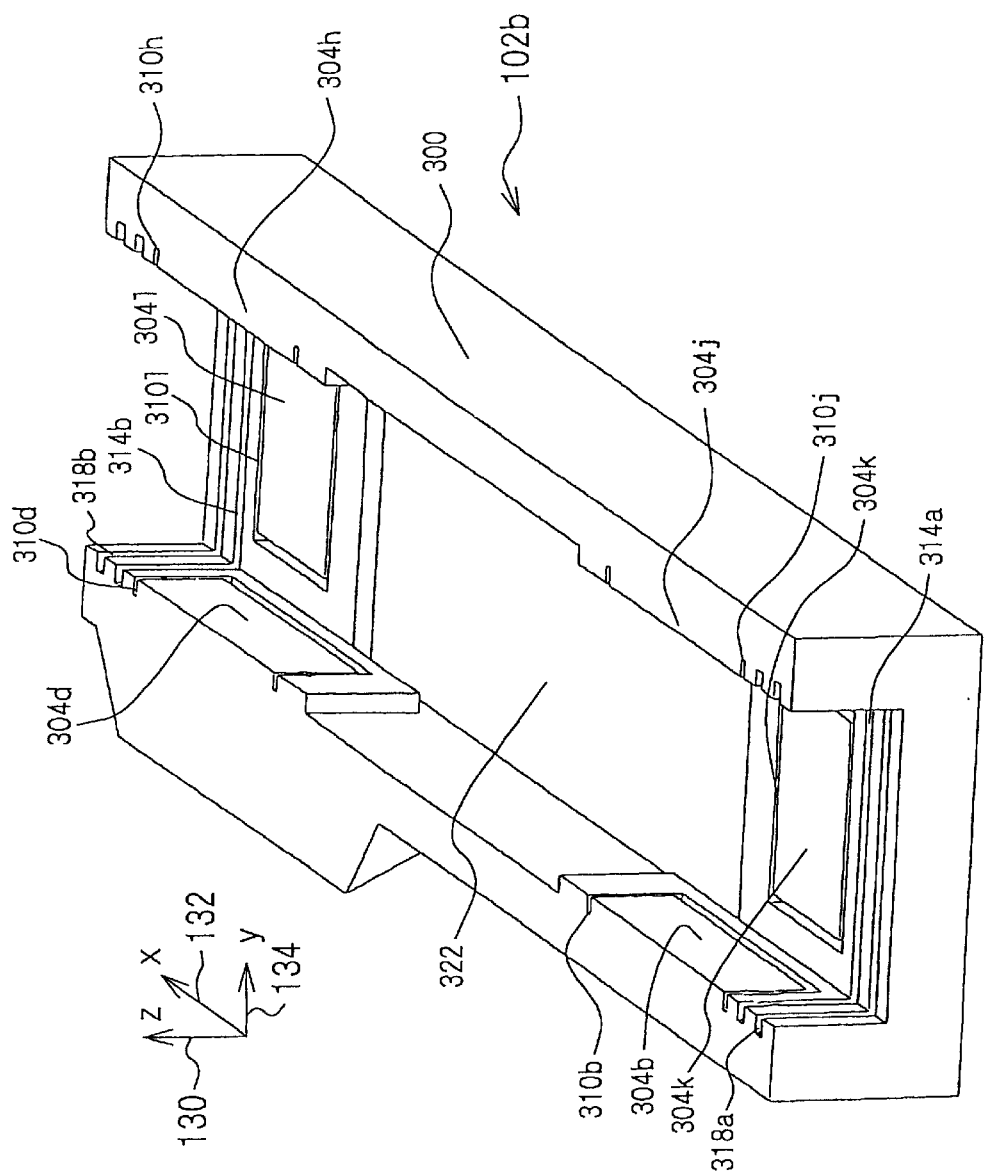
FIG. 3c is a diagrammatic representation of a third section of an air bearing linear guide, e.g., air bearing linear guide 102b of FIG. 2, in accordance with an embodiment of the present invention.

Each linear guide in a wafer stage, e.g., each of linear guides 102, 104, and 122, generally operates in substantially the same manner. Specifically, the general flow configurations of linear air guides 102 and 104 are substantially the same, whereas the flow configuration of linear air guide 122 is similar to the configurations of linear air guides 102 and 104. With reference to FIGS. 3a–c, linear guide 102b will be described in accordance with an embodiment of the present invention. Linear guide 102b, which is effectively an air bearing linear guide, is formed to include a rectangularly shaped sleeve 300. In general, sleeve 300 may be formed using any suitable method. By way of example, sleeve 300 may be formed from four plates which are matched to a guide beam, e.g., guide beam 108b of FIG. 2, such that a desired gap between linear guide 102b and the guide beam is maintained. The desired gap generally corresponds to the flying height of air bearing pads 304 within linear guide 102b. While the size of the desired gap may vary widely depending upon the requirements of the overall electron beam projection system, the desired gap size is typically in the range of approximately five to approximately seven microns.

Air pads 304, which are coupled to an air supply that typically supplies air at a pressure of between approximately 60 pounds per square inch (psi) and 80 psi, are positioned on each inner surface of linear guide 102b. It should be appreciated that air pads, 304 may be designed as any type of conventional air bearings. Conventional types of air bearings include, but are not limited to, porous air bearings. In the embodiment as shown, side surfaces of linear guide 102b, e.g., the sections of FIGS. 3a and 3b, may include four air pads 304 each, whereas a top surface or a bottom surface of linear guide 102b, as shown in FIG. 3c, may each include two air pads 304. It should be appreciated, however, that the number of air pads 304 as well as the location of air pads 304 within linear guide 102b may vary widely.

Air pads 304 are generally spaced to substantially minimize the length of linear guide 102b, e.g. the dimension of linear guide 102b along x-axis 132. By minimizing the length of linear guide 102b, the length of an associated guide beam, e.g., guide beam 108 of FIG. 2, may also be substantially minimized. Minimizing the length of the associated guide beam increases the torsional and bending stiffness associated with the guide beam. In the described embodiment, the length of linear guide 102b along x-axis 132 may be approximately the sum of the length of travel, i.e., the stroke of linear guide 102b, the length of an exhaust port associated with linear guide 102b, i.e., an exhaust port in guide beam 108b of FIG. 2, and the length of lands and channels at the edge of linear guide sleeve 300, i.e., sealing lands 340.

Air-flow evacuation stages 310, 314, 318, or grooves, are incorporated into linear guide 102b in order to reduce the volume of gas which reaches a vacuum chamber and, as a result, is pumped out of the vacuum chamber. Grooves 310, which directly surround air pads 304, are effectively atmospheric pressure grooves in that grooves 310 are arranged to contain gas at atmospheric pressure, i.e., at approximately 15 psi absolute. The existence of grooves 310 enables air pads 304 to function as if air pads 304 were not in a vacuum. That is, grooves 310 provide air pads 304 with an atmospheric pressure environment such that air pads 304 effectively function as if air pads were surrounded by gas at an atmospheric pressure. Typically, grooves 310 may be vented directly to atmospheric pressure through ports and hoses (not shown) to a vent located outside of a vacuum chamber in which linear guide 102b operates.

In one embodiment, grooves 310 may contain a low vacuum, e.g., a vacuum at approximately half of an atmosphere (atm), instead of atmospheric pressure. The use of a low vacuum may increase the evacuation of gas from linear guide 102b. A low, or weak, vacuum may also be applied to the end of a hose that is coupled to grooves 310 in order to compensate for flow restrictions so that the resulting pressure in grooves 310 may be approximately atmospheric, or in the range of approximately 2 psi to approximately 15 psi.

Lands 332 separate grooves 310 from low-vacuum pump-out grooves 314. In general, lands 332 each have substantially the same height, or thickness, as air pads 304 so that the gap between the guide beam, i.e., guide beam 108b, and lands 332 is substantially the same as the flying height of the overall air bearing. Lands 332, in cooperation between the gap between lands 332 and the outer surface of guide beam 108b of FIG. 3, essentially create a flow restriction which serves to reduce the leakage flow from grooves 310 to grooves 314. The length of lands 332 in the flow direction, e.g., the length of land 332a between grooves 310a and 314a along x-axis 132, may be determined such that conductance between grooves 310a and 314a may be minimized, as will be appreciated by those skilled in the art.

Grooves 314 are in fluid communication with low vacuum areas 322. Low vacuum areas, in turn, are in fluid communication with low vacuum transfer ports 344. Low vacuum transfer ports 304 may be ducted through beam 110b that serves as a guide beam for linear guide 104 of FIG. 2, which may be considered to be a "slider." In the embodiment as shown, low vacuum transfer ports 304 may be ducted through beam 110b and out a low vacuum opening 370a.

Low vacuum areas 322 are also arranged to encompass, or effectively enable flow into, a low vacuum port in guide beam 108b of FIG. 2, which will be described below with respect to FIGS. 5a and 5b. That is, low vacuum areas 322 are arranged such that while linear guide 102b moves with respect to guide beam 108b, low vacuum areas 322 are substantially always in fluid communication with a low vacuum port in guide beam 108b. The size of low vacuum areas 322 is generally relatively large in order to substantially maximize the conductance of low vacuum flow and to substantially minimize the total force on the inside of sleeve 300. Force on the inside of sleeve 300, as will be appreciated by those skilled in the art, has the tendency to expand and distort sleeve 300.

As shown in FIG. 3b, low vacuum areas 322 are in fluid communication with a low vacuum exhaust groove 328. Low vacuum exhaust groove 328 is arranged to overlap a low vacuum port in guide beam 108b of FIG. 2 such that a portion of low vacuum exhaust groove 328 substantially "covers" the low vacuum port during the stroke, i.e., movement, of linear guide 102b. The depth of low vacuum exhaust groove 328, or the dimension of low vacuum exhaust groove 328 along y-axis 134, is generally chosen to be between approximately 5 millimeters (mm) and 10 mm larger than the depth of low vacuum areas 322. Such a range in depth generally allows adequate conductance of low vacuum flow between low vacuum exhaust groove 328 and the low vacuum port. In general, low vacuum exhaust groove 328 facilitates the low vacuum flow between linear guide 102b and guide beam 108b, as will be discussed below with reference to FIGS. 5a and 5b.

Grooves 314 are separated from high vacuum grooves 318 by lands 336. Like lands 332, lands 336 are approximately the same height as air pads 304. High vacuum grooves generally contain a vacuum on the order of approximately $10^{-4}$ Torr. The actual pressure is dependent upon a variety of factors. The variety of factors may include, but are not limited to, pumping speed, conductance of an evacuation path, the relative dimensions of lands 332, 336, and the size or height of the gap between guide beam 108b and land 332, 336. Grooves 318 are arranged to conduct leakage to a high vacuum exhaust groove 326 which overlaps a high vacuum port in guide beam 108b of FIG. 2, as will be described below with respect to FIGS. 5a and 5b. High vacuum exhaust groove 326 is also in fluid communication with a high vacuum transfer port 374 which transfers a high vacuum between high vacuum exhaust groove 326 and slider 104 of FIG. 2 through beam 110b. It should be appreciated that beam 110b is internally divided into two ducts, one which supports high vacuum flow and has a high vacuum opening 370b, and one which supports low vacuum flow and has low vacuum opening 370a, as will be described below with reference to FIG. 4. Further, each duct may be connected to a pump, e.g., a high vacuum flow duct may be in communication with a high vacuum pump while a low vacuum flow duct may be in communication with a low vacuum pump. In general, pumps may be connected to either one of guide beams 108, which are in communication with guide beam 110b.

An extension 382 of beam 110b includes an air pad 384 which is arranged to interface with an air guide, i.e., air guide 133 of FIG. 2, which may be surrounded by an atmospheric pressure groove, a low vacuum groove, and a high vacuum groove. In one embodiment, extension 382 includes a second air pad (not shown) which is located on the opposite side of extension 382 from air pad 384. It should be understood that in lieu of a single air pad 384 on two opposing sides of extension 382, each side of the two opposing sides of extension 382 may include two or more air pads. Air pad 384 is similar to air pads 304, and, like air pads 304, is surrounded by an atmospheric pressure groove. Air pad 384 is arranged to move within an air guide, e.g., air guide 133b of FIG. 2, as will be described below with reference to FIG. 6.

Lands 340, i.e., flow-restriction lands or sealing lands, separate grooves 318 from the ends of sleeve 300. In other words, lands 340 effectively seal off grooves 318 from the exterior of linear guide 102b such that the flow of high vacuum, or any other flow, is substantially restricted from flowing into a vacuum chamber in which liner guide 102b is used.

In the described embodiment, air bearing leakage may be exhausted through atmospheric pressure grooves 310 to a flexible hose which is connected to the air that is outside of a vacuum chamber in which linear guide 102b operates. Leakage from atmospheric pressure grooves 310 is exhausted from low vacuum grooves 314 through ports to a low vacuum duct in beam 110b. Finally, leakage from low vacuum grooves 318 is exhausted from high vacuum grooves 318 through ports to a high vacuum duct of beam 110b.

Figure 4:
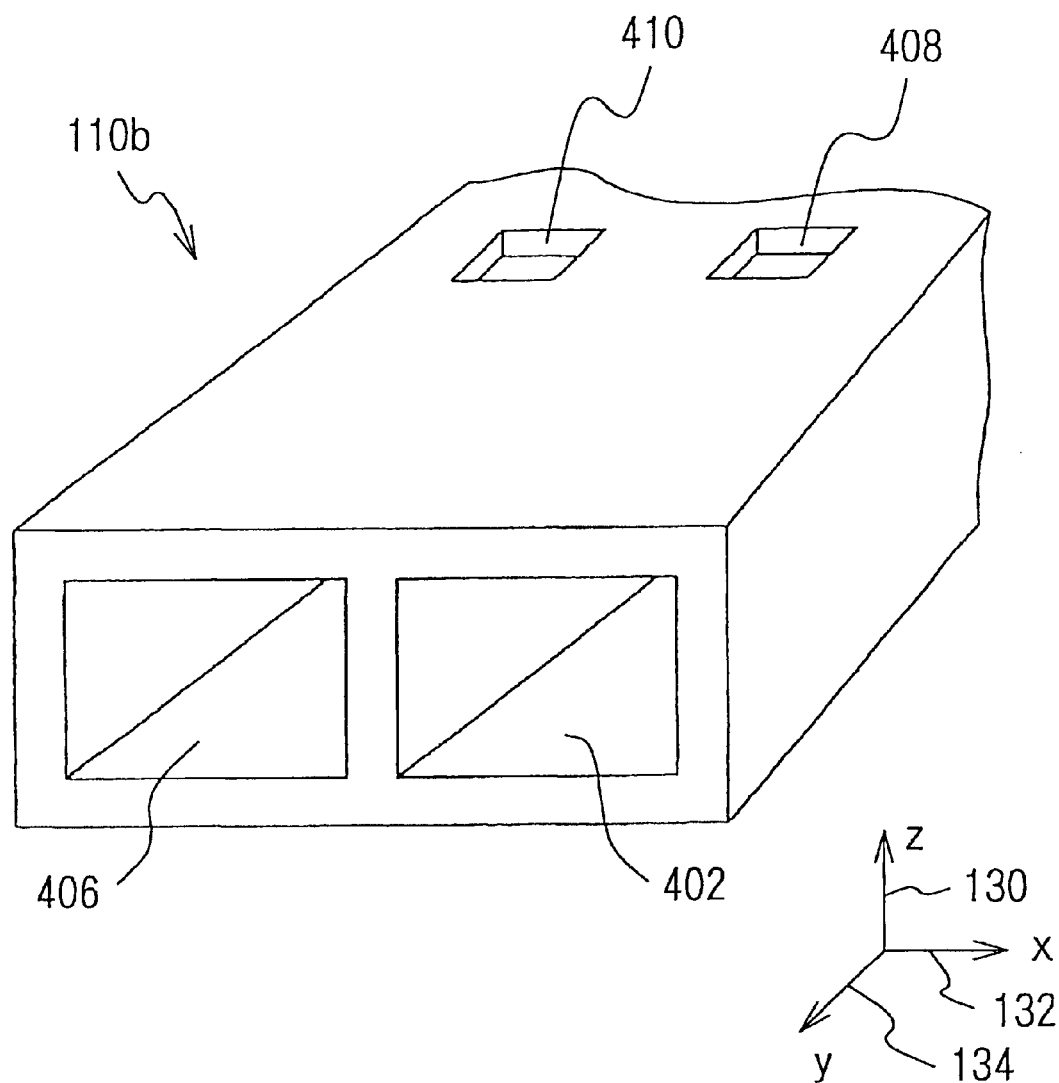
FIG. 4 is a diagrammatic representation of a portion of a guide beam, e.g., guide beam 110b of FIG. 2, in accordance with an embodiment of the present invention.

As previously mentioned, beam 110b, which is substantially fixably attached to linear guide 102b, may include two ducts. FIG. 4 is a diagrammatic representation of a portion of guide beam 110b in accordance with an embodiment of the present invention. Guide beam 110b includes a low vacuum flow duct 402 and a high vacuum flow duct 406. Generally, guide beam 110b includes at least one low vacuum opening 408 and one high vacuum opening 410, in order to allow vacuum flow to pass to linear guide 102b from slider 104 of FIG. 2. By way of example, in the described embodiment, guide beam 110b may include low vacuum opening 408 and low vacuum opening 370a, as shown in FIG. 3a, which are located on opposing sides of guide beam 110b. Similarly, guide beam 110b may include high vacuum opening 410 and high vacuum opening 370b, as shown in FIG. 3b. It should be appreciated, however, that the number of openings may vary widely, e.g., guide beam 110b may only include low vacuum opening 370a and high vacuum opening 370b. It should be appreciated that the configuration of openings may also vary widely. For example, guide beam 110b may include only opening 370b and opening 408, or guide beam 110b may include only opening 370a and 410.

Figure 5A:
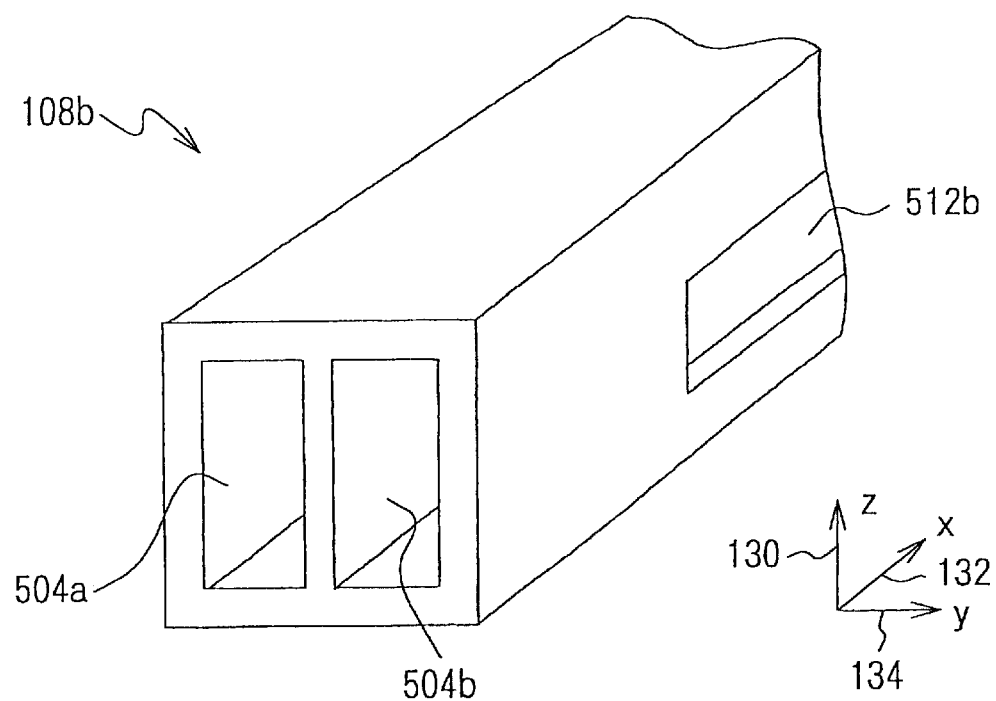
FIG. 5a is a diagrammatic representation of a portion of a guide beam, e.g., guide beam 108b of FIG. 2, in accordance with an embodiment of the present invention.
Figure 5B:
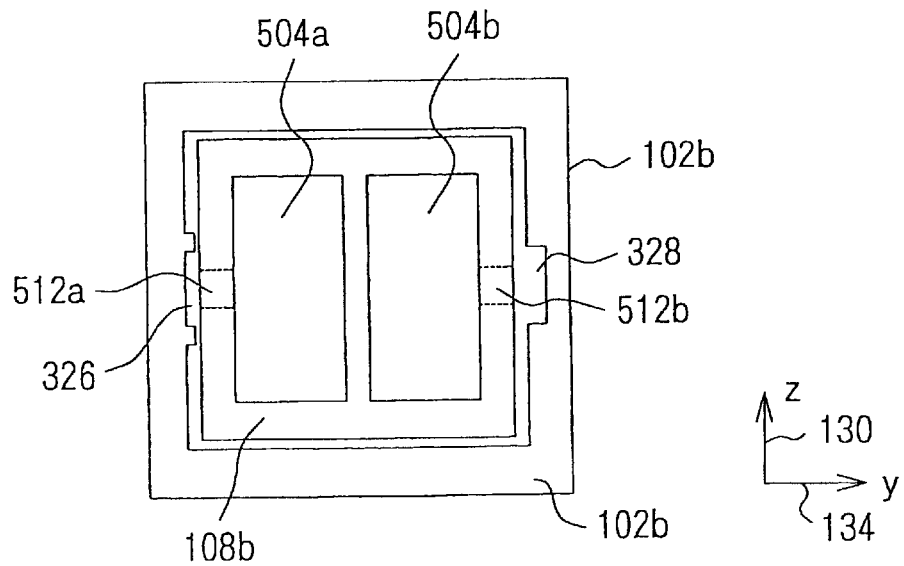
FIG. 5b is a diagrammatic cross-sectional representation of a guide beam within an air bearing linear guide, e.g., guide beam 108b and air bearing linear guide 102b of FIG. 2, in accordance with an embodiment of the present invention.

Referring next to FIGS. 5a and 5b, a guide beam, i.e., guide beam 108b of FIG. 2, will be described in accordance with an embodiment of the present invention. Guide beam 108b includes two ducts or sections 504 which are substantially adjacent to each other along y-axis 134. In other words, ducts 504 of guide beam 108b are arranged such that duct 504a is adjacent to duct 504b along y-axis 134. Duct 504a is arranged to accommodate a high vacuum flow while duct 504b is arranged to accommodate a low vacuum flow.

Linear guide 102b is effectively wrapped around guide beam 108b such that a low vacuum exhaust port 512b is substantially always encompassed within low vacuum exhaust groove 328 while linear guide 102b moves with respect to guide beam 108b. Similarly, during the stroke of linear guide 102b, a high vacuum exhaust port 512a is substantially always encompassed by high vacuum exhaust groove 326. It should be appreciated that for ease of illustration, although linear guide 102b includes air pads and grooves, air pads and grooves have generally not been shown in FIG. 5b.

When linear guide 102b effectively slides over guide beam 108b, low vacuum gas flows between low vacuum exhaust groove 328 and duct 504b. As discussed above with reference to FIG. 3a, low vacuum gas also flows between low vacuum exhaust groove 328 and beam 110b. High vacuum gas flows from high vacuum exhaust groove 326 into exhaust port 512a and then into duct 504a.

In one embodiment, duct 504a may be connected to a high vacuum pump while duct 504b maybe connected to a low vacuum pump. As guide beam 108b is generally stationary, e.g., does not move in any direction, pumps may be substantially directly connected to ducts 504 without the use of flexible hoses. However, it should be appreciated that in the event that guide beam 108b and, further, overall wafer stage 100 of FIG. 2, maybe mounted on an apparatus to move wafer stage 100 along z-axis 130, ducts 504 may be connected to pumps using flexible hoses. The use of flexible hoses enables guide beam 108b to be moved along z-axis 130 without affecting the connections of ducts 504 to the pumps.

Figure 6:
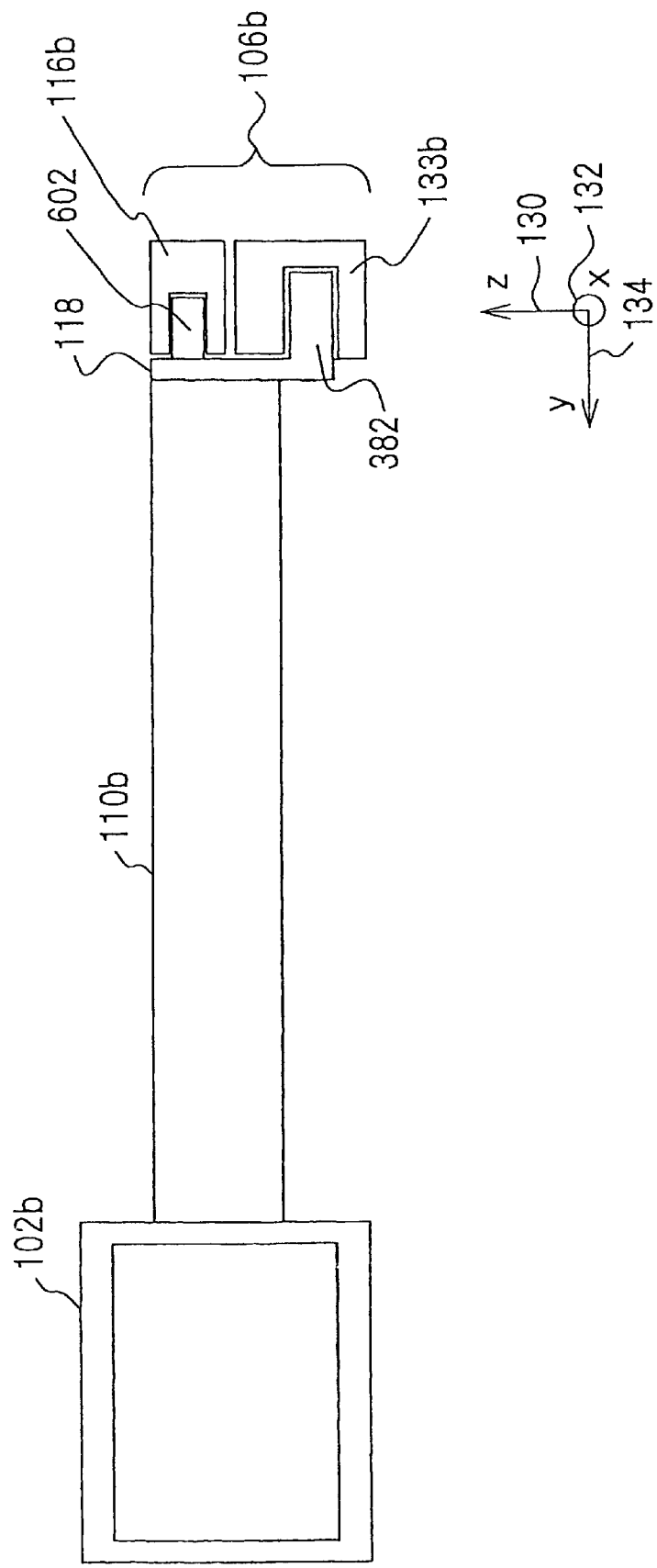
FIG. 6 is a diagrammatic side-view representation of an air bearing linear guide and a guide beam, e.g., linear guide 102b and guide beam 110b of FIG. 2, in accordance with an embodiment of the present invention.

As previously mentioned, a linear motor may be used to drive the movement of a linear guide. By way of example, guide section 106b of FIG. 2 includes a linear motor which includes coil 116b and extension section 118. With reference to FIG. 6, guide section 106b will be described in accordance with an embodiment of the present invention. Guide section 106b includes magnet track 116b and guide 133b. A coil 602 is arranged to move within magnet track 116b to form a linear motor. Extension 382, as discussed above with respect to FIG. 3a, includes at least one air pad and moves within guide 133b along x-axis 132. The air pads on associated with extension 382 are generally arranged such that the air pads are substantially surrounded by an atmospheric pressure groove, a low vacuum groove, and a high vacuum groove. In one embodiment, extension 382 may include four air pads, i.e., two air pads on the top side of extension 382 and two air pads on the bottom side of extension 382. The use of four air pads enables stiffness, i.e., pitching stiffness about y-axis 134, to be obtained with respect to guide beam 110b and linear guide 102b. The use of air pads on opposing sides of extension 382 effectively preloads air pads against each other and increases stiffness.

Air pads on extension 382 may be substantially directly supplied with air via an air hose. As extension 382 is directly coupled to guide beam 110b, and does not move with respect to guide beam 110b, low vacuum flow and high vacuum flow may effectively be directly vented between or exhausted between guide beam 110b and extension 382.

Although only a few embodiments of the present invention have been described, it should be understood that the present invention may be embodied in many other specific forms without departing from the spirit or the scope of the present invention. By way of example, a wafer stage with air bearing linear guides has been described as being suitable for use in a vacuum chamber associated with an electron beam projection system. It should be appreciated, however, that the wafer stage or, more generally, the air bearing linear guides described above may be used in substantially any suitable vacuum environment. Suitable vacuum environments include, but are not limited to, vacuum environments associated with ion beam projection lithography and extreme ultraviolet lithography. Alternatively, the air bearing linear guide of the present invention may also be implemented in non-vacuum environments, e.g., where a pure gas environment should not be contaminated by gas flow from a bearing.

The design of air bearing linear guides which may be used in a vacuum environment, has been described as including air pads and various channels for vacuum flow. It should be appreciated that the configuration of air bearing linear guides described above is just one example of air bearing linear guides which are suitable for use in a relatively high vacuum environment. Further, the design of the air bearing linear guides may vary from the design described above without departing from the spirit or the scope of the present invention. For example, the number of air pads in an air bearing linear guide may vary depending upon the requirements of a particular system. In addition, the number of grooves or channels and, hence, lands may also vary, e.g., a high vacuum groove may be eliminated in some embodiments.

While the air bearing linear guide has been described as being suitable for use in a scanning reticle stage, the air bearing linear guide may be used with a variety of different stages. Different stages include, but are not limited to, reticle and mask stages. It should be appreciated, in addition, that the air bearing linear guide may be implemented for substantially any suitable use, and is not limited to use within a stage.

In general, a linear guide is formed from as a rectangularly shaped sleeve with an inner surface, on which air pads are incorporated, and an outer surface. The outer surface is exposed to relatively high vacuum levels, e.g., vacuum levels of approximately 1 e-6 Torr associated with an electron beam projection system, whereas different areas of the inner surfaces are subject to pressures ranging from air bearing supply pressure to approximately $10^{-4}$ Torr. The assembly of a linear guide or, more specifically, the sleeve may vary. By way of example, the sleeve may be assembled from four plates, and matched to the guide beam to maintain a desired gap between the inner surface, including air pads, of the sleeve and the guide beam. The sleeve assembly may generally be held together, for example, using adhesives or screws. The four plates may be assembled such that the ends of a bottom plate and a top plate are exposed, e.g., not in contact with either side plate, while the ends of the side plates abut the bottom plate and the top plate. Similarly, the four plates may be assembled such that the ends of the side plates are exposed, e.g., not in contact with either the top plate or the bottom plate, while the ends of the top plate and the bottom plate abut the sides of the side plates. While such assemblies may be acceptable, such assemblies do not facilitate the adjustment of the gap between the inner surface of the sleeve and the guide beam. For instance, in order to alter the size of the gap, the size of at least some of the plates would need to be altered.

The joints of an assembled rectangularly shaped sleeve of the embodiment described above are arranged to restrict the flow of vacuum gases in areas 322 from leaking into the vacuum chamber that houses the overall wafer stage. Additionally, some length of a joint 392 of FIG. 3a, e.g., the intersection or junction between land 332a and land 332f, is subject to approximately atmospheric pressure gases and, hence, are arranged to restrict flow into the chamber. It should be appreciated that substantially all joints between adjacent lands 332 are arranged to restrict the flow of low vacuum gases into the chamber. Similarly, a joint 394, which is located at a corner of land 336a as shown in FIG. 3a, is also arranged to restrict flow into the chamber.

In one embodiment, a sleeve may be assembled such that each plate has an end that is exposed and an end that abuts the side of another plate. Assembling the four plates of a sleeve such that each plate has an end that is exposed and an end that abuts the side of another plate enables the gap between the inner surface of the sleeve and the guide beam to be readily altered, without departing from the spirit or the scope of the present, invention.

Generally, if lower vacuum levels are needed, an air bearing linear guide may be designed such that any combination of atmospheric, low vacuum, and high vacuum exhaust grooves may be used with any combination of hoses and internal ducts. On the other hand, if higher vacuum levels are needed, then an additional exhaust groove with ultra-high vacuum may be added to a bearing assembly and exhausted through an additional duct. That is, the actual design of the air bearing linear guide may vary depending upon the requirements of a particular system, e.g., stage system.

The beams, or guide beams, of the present invention are generally dual-chambered. Both the design of the dual-chambered beams and dimensions of the dual-chambered beams may be widely varied. By way of example, while the chambers or ducts in a beam have been described as being side-by-side such that the chambers are adjacent to each other along a y-axis, the chambers and ducts in a beam may instead be aligned side-by-side such that the chambers are adjacent to each other along a z-axis. Therefore, the present examples are to be considered as illustrative and not restrictive, and the invention is not to be limited to the details given herein, but may be modified within the scope of the appended claims.

What is claimed is:

1. An air bearing linear guide suitable for use in a vacuum environment, the air bearing linear guide being arranged to substantially wrap around a portion of a guide beam, the air bearing linear guide comprising:
    a sleeve, the sleeve having an inner surface;
    a first air pad, the first air pad being located on the inner surface of the sleeve;
    a first land, the first land being arranged on the inner surface of the sleeve at least partially around the first air pad;
    a first channel, the channel being defined between the first air pad and the first land, wherein the first channel is arranged to be vented to a non-vacuum environment; and
    a second land, the second land being arranged to substantially seal the inner surface of the sleeve from the vacuum environment;
    wherein a height of the first land and a height the first air pad are approximately the same.

2. An air bearing linear guide according to claim 1, wherein the second land is arranged to substantially seal the sleeve against the guide beam.

3. An air bearing linear guide suitable for use in a vacuum environment, the air bearing linear guide being arranged to substantially wrap around a portion of a guide beam, the air bearing linear guide comprising:
    a sleeve, the sleeve having an inner surface;
    a first air pad, the first air pad being located on the inner surface of the sleeve;
    a first land, the first land being arranged on the inner surface of the sleeve at least partially around the first air pad;
    a first channel, the channel being defined between the first air pad and the first land, wherein the first channel is arranged to be vented to a non-vacuum environment; and
    a second land, the second land being arranged to substantially seal the inner surface of the sleeve from the vacuum environment;
    wherein the second land is arranged to substantially seal the sleeve against the guide beam; and
    wherein when the second land is substantially sealed against the guide beam, a gap is defined between the first land and the guide beam, the gap being substantially the same as a flying height of the air pad.

4. An air bearing linear guide according to claim 3 further including:
    a third land, the third land being spaced apart from the first land to at least partially define a second channel, the second channel being arranged to contain gas at a relatively low vacuum.

5. An air bearing linear guide according to claim 4 further including:
    a third channel, the third channel being at least partially defined between the third land and the second land, wherein the third channel is arranged to contain gas at relatively high vacuum.

6. An air bearing linear guide according to claim 5 wherein the third channel is in fluid communication with the guide beam.

7. An air bearing linear guide according to claim 5 wherein the gas at the relatively low vacuum is in the range of approximately 0.1 Torr to approximately one Torr, and the gas at the relatively high vacuum is on the order of approximately $10^{-4}$ Torr.

8. An air bearing linear guide suitable for use in a vacuum environment, the air bearing linear guide being arranged to substantially wrap around a portion of a guide beam, the air bearing linear guide comprising:

a sleeve, the sleeve having an inner surface;

a first air pad, the first air pad being located on the inner surface of the sleeve;

a first land, the first land being arranged on the inner surface of the sleeve at least partially around the first air pad;

a first channel, the channel being defined between the first air pad and the first land, wherein the first channel is arranged to be vented to a non-vacuum environment;

a second land, the second land being arranged to substantially seal the inner surface of the sleeve from the vacuum environment;

a third land, the third land being spaced apart from the first land to at least partially define a second channel, the second channel being arranged to contain gas at a relatively low vacuum; and a first area, the first area being on the inner surface of the sleeve, the first area further being in communication with the second channel and arranged to be in fluid communication with the guide beam.

9. An air bearing linear guide according to claim 8 further including:

a first exhaust groove, wherein the first area is in fluid communication with the guide beam through the first exhaust groove.

10. A guide bearing, the guide bearing being arranged to interface with a guide beam, the guide bearing further being arranged to move with respect to the guide beam, the guide bearing comprising:

a sleeve, the sleeve having an inner surface and an outer surface, wherein the outer surface is exposed to a vacuum;

a plurality of air pads, the plurality of air pads being included on the inner surface of the sleeve, wherein each air pad included in the plurality of air pads has a first height;

a plurality of raised areas, each raised area of the plurality of raised areas being arranged to define an individual channel between each raised area and a corresponding air pad, wherein each raised area included in the plurality of raised areas has a second height, the second height being substantially the same as the first height, each individual channel being arranged to vent to an atmospheric pressure environment;

a first plurality of lands, each land of the first plurality of lands being arranged to define a channel between each land of the first plurality of lands and a corresponding raised area, the channel between each land of the first plurality of lands and the corresponding raised area being arranged to accommodate flow of relatively low vacuum gas; and a second plurality of lands, each land of the second plurality of lands being arranged to define a channel between each land of the second plurality of lands and each land of the first plurality of lands, the channel between each land of the second plurality of lands and each land of the first plurality of lands being arranged to accommodate flow of relatively high vacuum gas.

11. A guide bearing according to claim 10 wherein each raised area of the first plurality of raised areas and the channel between each land of the first plurality of lands are arranged to cooperate to create a flow restriction between the channel between each land of the first plurality of lands and the corresponding raised area, and the channel between each land of the second plurality of lands and each land of the first plurality of lands.

12. A guide bearing system, the guide bearing system comprising:

an air bearing linear guide, the air bearing linear guide including a sleeve, the sleeve having an inner surface which includes an air pad, the air pad being separated from a first land by a first area which substantially surrounds a perimeter of the air pad, the first area being arranged to be in communication with a source of substantially atmospheric pressure; and a first guide beam, the air bearing linear guide being arranged to substantially wrap around a non-end section of the first guide beam and to slide with respect to the guide beam, wherein the guide beam includes a first duct and a second duct, the first duct and the second duct being in fluid communication with the air bearing linear guide.

13. A guide bearing system according to claim 12 wherein the first land is separated from a second land by a second area, the second area being arranged to be in fluid communication with the first duct.

14. A guide bearing system according to claim 13 wherein the second land is separated from a third land by a third area, the third area being arranged to be in fluid communication with the second duct.

15. A guide bearing system according to claim 14 wherein the guide bearing system further includes a first pump, the first pump being coupled to the first duct to substantially pump low vacuum gas through the first duct.

16. A guide bearing system according to claim 15 wherein the guide bearing system further includes a second pump, the second pump being coupled to the second duct to substantially pump high vacuum gas through the second duct.

17. A guide bearing system according to claim 14 further including a second guide beam, the second guide beam including a first section and a second section, the second guide beam being coupled to the air bearing linear guide, wherein the air bearing linear guide includes a first transfer port and a second transfer port, the first transfer port being in fluid communication with the second area and the first section, the second transfer port being in fluid communication with the third area and the second section.

18. A guide bearing system according to claim 12 wherein a gap is defined between a top surface of the air pad and an outer surface of the first guide beam.

19. A guide bearing system according to claim 18 wherein the gap is approximately equivalent to a flying height of the air bearing linear guide.

20. A guide bearing system according to claim 12 wherein the sleeve is substantially slidably sealed against the first guide beam.

21. A guide bearing for use in a vacuum environment, the guide bearing being arranged to substantially wrap around a portion of a guide beam, the guide bearing comprising:

a sleeve, the sleeve including an inner surface; and an air pad surrounded by a plurality of at least three grooves and a plurality of lands, the air pad being mounted on the inner surface, the each groove of the plurality of grooves being vented to a different pressure, wherein the different pressures decrease with a distance of each groove from the air pad, the plurality of lands being arranged to restrict flow conductance between the plurality of grooves; and wherein when the plurality of lands are substantially sealed against the guide beam, a gap is defined between the plurality of lands and the guide beam, the gap being substantially the same as a flying height of the air pad.

22. A guide bearing according to claim 21 wherein the plurality of grooves include:

an atmospheric pressure groove;

a low vacuum groove; and a high vacuum groove.

23. A guide bearing according to claim 22 wherein the atmospheric pressure groove is located closer to the air pad than the low vacuum groove, and the low vacuum groove is located closer to the air pad than the high vacuum groove.

24. A guide bearing according to claim 23 herein the low vacuum groove is vented to a first vacuum pump, and the high vacuum groove is vented to a second vacuum pump.

25. A guide bearing according to claim 21 further including a plurality of air pads, the plurality of air pads being arranged to provide the sleeve with at least one of torsional stiffness and bending stiffness.

* * * * *